United States Patent [19]

Yamamoto et al.

[11] Patent Number: 4,928,071
[45] Date of Patent: May 22, 1990

[54] LIMITER CIRCUIT

[75] Inventors: Hideo Yamamoto; Takeshi Sato; Toshikazu Yoshimi; Shuichi Mori; Akio Tokumo, all of Saitama, Japan

[73] Assignee: Pioneer Electronic Corporation, Tokyo, Japan

[21] Appl. No.: 213,051

[22] Filed: Jun. 29, 1988

[30] Foreign Application Priority Data

Aug. 31, 1987 [JP] Japan .............. 62-131367[U]

[51] Int. Cl.5 .............................................. H03G 3/20
[52] U.S. Cl. .................................. 330/129; 330/126; 330/86
[58] Field of Search ............... 307/540, 556; 330/126, 330/129, 131, 132, 140, 141, 278, 279, 280, 281, 302, 306

[56] References Cited

U.S. PATENT DOCUMENTS 4,249,042 3/1981 Orban ............................ 330/86 X
4,471,318 9/1984 Akagiri ........................ 330/126 X Primary Examiner—Steven Mottola
Attorney, Agent, or Firm—Sughrue, Mion, Zinn, Macpeak & Seas

[57] ABSTRACT

A limiter circuit divides the output of a low frequency amplifier into two parts which are respectively high pass filtered, and low frequency amplitude limited. The two parts may be recombined to form an audio output which is freed from clipping distortion at the low end, while the high end is increased. The invention is especially suited for environments such as automobiles, where the ambient noise level may be high.

7 Claims, 3 Drawing Sheets

LIMITER CIRCUIT

BACKGROUND OF THE INVENTION

1. Field of the Invention

This invention relates to an improvement in a limiter circuit, which, when the input applied to a low frequency amplifier is extremely high in level, automatically amplitude controls the output of the low frequency amplifier according to the level thereof, because in such a case the input is clipped and therefore the output is distorted.

2. Description of the Prior Art

One example, of a conventional limiter circuit of this type is shown in FIG. 1. The conventional limiter circuit will be described with reference to that figure.

In FIG. 1, reference numeral 1 designates a voltage gain controlled amplifier to which the output of a low frequency amplifier (not shown) is applied; 2, an amplifier for amplifying the output of the voltage gain controlled amplifier; 3, a time constant circuit for blocking or delaying the output of the amplifier 2 for a predetermined delay time; and 4, a rectifier circuit for converting the output of the time constant circuit 3 into a dc output.

In the limiter circuit thus organized, the output of the low frequency amplifier is applied to the voltage gain controlled amplifier 1. A part of the output of the amplifier 1 is amplified by the amplifier 2 and delayed for the predetermined period of time by the time constant circuit 3, and it is converted into a dc output by the rectifier circuit 4, and fed back to the voltage gain controlled amplifier 1. The application of the output to the rectifier circuit 4 is suspended by the time constant circuit 3 for the predetermined period of time. The aforementioned control voltage output from the rectifier circuit 4 changes with the output level of the low frequency amplifier, and therefore the output level is controlled in amplitude by the voltage gain controlled amplifier 1. Accordingly, as the output level of the low frequency amplifier increases, the output level is effectively controlled in amplitude by the voltage gain controlled amplifier 1 over the entire frequency band.

In the above-described conventional limiter circuit, the output level is damped over the entire frequency band. Therefore, the operation of the limiter circuit will cause a so-called "breathing effect" such that the level variation in the higher frequency range offends the ear.

When an excessively great input is applied, the low frequency band is especially considered because of the following reason: In general, operation of the limiter circuit is required when high frequency signals are superposed on low frequency signals. Since, with acoustic power taken as a reference, high frequency signals are originally lower in amplitude level than low frequency signals, high frequency signals are more difficult to clip than low frequency signals. Therefore, with high frequency signals, clipping distortion scarcely takes place, and such distortion is not so offensive to the ear as that with low frequency signals. Hence, it is unnecessary to effect the limiting operation over the entire frequency band; that is, the limiting operation should be effected only for the low frequency components.

In the case of a mobile audio device mounted on a vehicle, the electric power source is of the order of 12V, and therefore it is rather difficult to provide a high power amplifier; however, because of high road noise, it is positively necessary to increase the acoustic output, especially the lower frequency level acoustic output. In this case, with the amplifier operated using the electric power thus limited, the low frequency band is clipped.

Let us consider the case where limiter control is carried out for each channel. If, in this case, the channels differ from each other in the attenuation of high frequency components, then since the high frequency components are significant in directivity the sound image is variable in localization, which is offensive to the ear.

Furthermore, the voltage gain controlled amplifier 1 in the limiter circuit produces noise in the high frequency region, and therefore the output may include noise components attributable to the voltage gain controlled amplifier 1.

SUMMARY OF THE INVENTION

Accordingly, an object of this invention is to eliminate the above-described difficulties accompanying the conventional limiter circuit.

More specifically, a first object of this invention is to provide a limiter circuit which performs the limiting operation only in the low frequency band, and which eliminates noise signals generated by the voltage gain controlled amplifier.

A second object of the invention is to provide a limiter circuit in which the limiter control operation start level can be freely selected, and in which the operation start time and the operation end time can be set as desired.

The foregoing and other objects of the invention have been achieved by the provision of a limiter circuit which, according to the invention, comprises: control voltage generating means for receiving the output of a low frequency amplifier, to generate a control voltage according to the output level thereof; and voltage gain controlled means for amplitude limiting only the low frequency component of the output of the low frequency amplifier, with the aid of the control voltage.

DETAILED DESCRIPTION OF THE PREFERRED EMBODIMENTS

Figure 1:
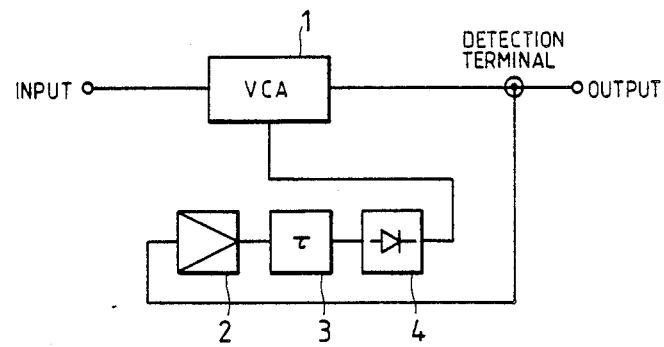
FIG. 1 is a block diagram showing a conventional limiter circuit.

A first example of a limiter circuit according to this invention will be described with reference to FIG. 2, in which those components which have been described with reference to FIG. 1 are designated by the same reference numerals.

Figure 2:
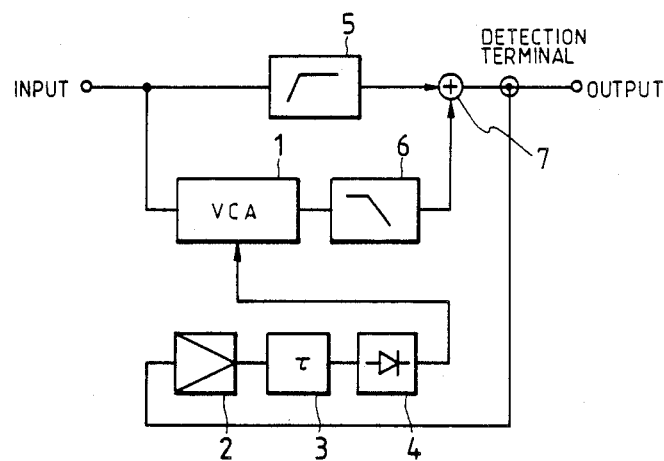
FIG. 2 is a block diagram showing a first example of a limiter circuit according to this invention.

In FIG. 2, reference numeral 5 designates a high-pass filter to which the output of the low frequency amplifier (not shown) is applied. The voltage gain controlled amplifier 1 (hereinafter referred to as "VCA 1", when applicable) is connected in parallel with the high-pass filter 5. More specifically, the output of the VCA 1 is applied through a low-pass filter 6 and added to the output of the high-pass filter 5.

The control signal from the control voltage generating means is applied to the VCA 1.

The operation of the limiter circuit thus organized will be described.

Figure 4:
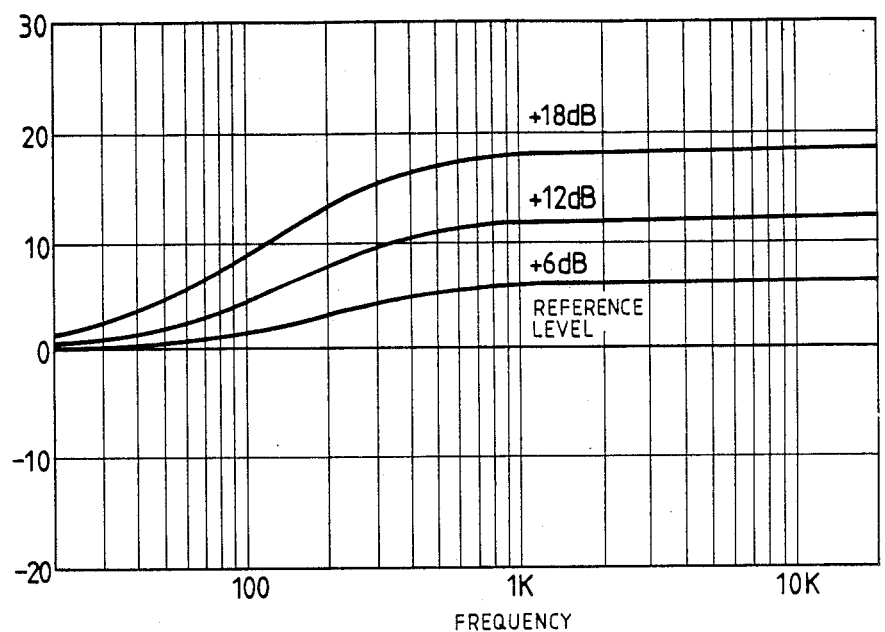
FIG. 4 is a graphical representation indicating input and output level in the limiter circuit according to the invention.

A part of the output signal, i.e. the sum of the output of the high-pass filter 5 and that of the low-pass filter 6, is applied to the VCA 1 through a control voltage generating means which is smaller to that in the conventional limiter circuit of FIG. 1. The VCA 1 is connected in parallel with the high-pass filter 5, and thus a part of the input is applied to the VCA 1. This input is subjected to amplitude limitation, and of the amplitude-limited output, only the low frequency component is superposed back on the original signal line, with the aid of the low-pass filter 6. The relationships of the input to output levels in this case are as indicated in FIG. 4.

Figure 5:
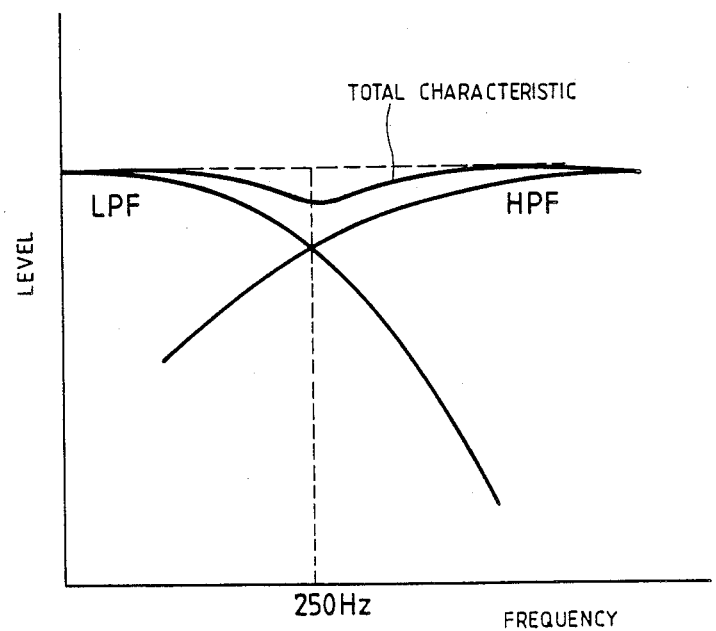
FIG. 5 is a graphical representation indicating the output characteristics of a high-pass filter and a low-pass filter in the limiter circuit according to the invention.

The band limiting cut-off frequencies of the high-pass filter 5 and the low-pass filter 6 should cross over each other to cover the entire frequency band. It is preferable for the cross-over to occur at about 300 Hz or lower, for the following reason: A mobile audio device has the special effect that the sound pressure level exhibits a peak at 200 to 300 Hz. Therefore, if, at the frequency corresponding to the peak, the cross-over is set to provide a shallow dip in the composite frequency characteristic as shown in FIG. 5, then the output characteristics of the two filters, being cancelled by each other, provide a relatively flat output characteristic for the limiter circuit.

Figure 3:
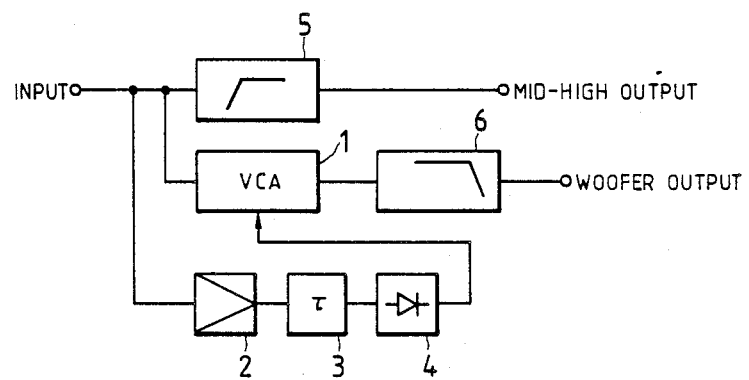
FIG. 3 is a block diagram showing one modification of the limiter circuit according to the invention.

In the above-described limiter circuit, the amplitude-limited output of the VCA 1 is applied to the low-pass filter 6, the output of which is applied to the output of the high-pass filter 5; that is, the output of the VCA 1 is superposed on the original signal line through the low-pass filter 6. However, the limiter circuit may be modified as shown in FIG. 3, so that it can be used for a multi-way loudspeaker system without signal recombination.

Figure 6:
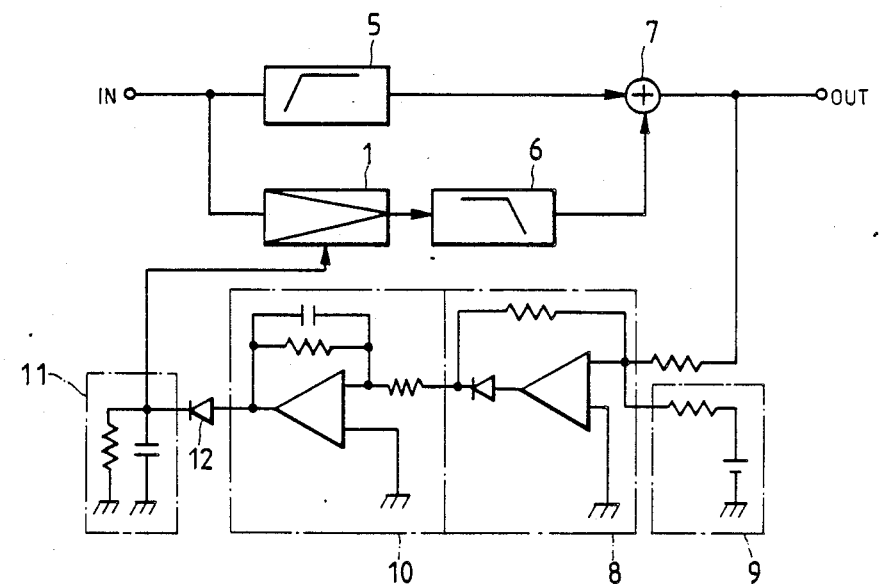
FIG. 6 is a block diagram showing a second example of the limiter circuit according to the invention.

A second example of the limiter circuit according to the invention is as shown in FIG. 6, in which those components which have been described with reference to FIG. 1 are designated by the same reference numerals.

In FIG. 6, reference numeral 5 is a high-pass filter to which the output of the low frequency amplifier (not shown) is applied; and 6, a low-pass filter connected in series with the VCA 1, the series circuit of the low-pass filter and the VCA 1 being connected in parallel to the high-pass filter 5. The output of the high-pass filter 5 and the output of the low-pass filter 6 are applied to an adder 7 which is connected to an output terminal OUT.

Further in FIG. 6, reference numeral 8 designates a rectifier circuit for rectifying the output of the adder 7; 9, an adjustable voltage threshold value setting circuit, the output of which is applied to the rectifier circuit 8; 10, an integrating circuit for integrating the output of the rectifier circuit 8; and 11, a release (recovery) time constant circuit for delaying for a predetermined period of time the output of the integrating circuit 10 which is applied through a diode 12 thereto.

The operation of the limiter circuit thus organized will be described.

The output of the low frequency amplifier is applied through the high-pass filter 5 to the adder 7 on one hand, and through the VCA 1 and the low-pass filter 6 to the adder 7 on the other. The output of the adder 7 is applied to the output terminal OUT. A part of the output provided at the output terminal is applied to the rectifier circuit 8. The threshold voltage of the threshold value setting circuit 9 is also applied to the rectifier circuit 8, as a result of which the threshold value provided by the threshold value setting circuit 9 is superposed on the output of the rectifier circuit. The output of the rectifier circuit 8 is integrated by the integrating circuit 10, the output of which is applied through the diode 12 to the time constant circuit 11. The output, after being delayed for a predetermined period of time by the time constant circuit 11, is applied, as a control signal, to the VCA 1. As was described above, the voltage gain controlled amplifier 1 is connected in parallel to the high-pass filter 5, and the output of the low frequency amplifier is applied through the input terminal IN to the amplifier 1. Therefore, the input is amplitude-limited, and of the output thus amplitude-limited, only the low frequency component is superposed on the original signal line by means of the low-pass filter 6 and adder 7.

The relationships between the input to output levels in this case are the same as those shown in FIG. 4. The band limiting cut-off frequencies of the high-pass filter 5 and the low-pass filter 6 should cross-over each other to cover the entire frequency band. It is preferable that the cross-over occurs at about 300 Hz or lower, for the reason explained above.

Figure 7:
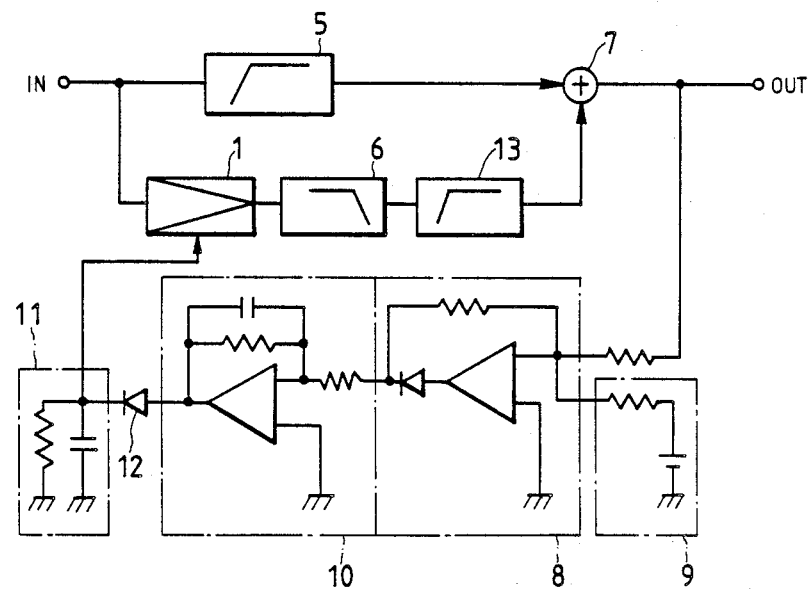
FIG. 7 is a block diagram showing one modification of the limiter circuit shown in FIG. 6.

FIG. 7 shows one modification of the limiter circuit illustrated in FIG. 6. The limiter circuit of FIG. 7 can be obtained by connecting a low-cut filter 13 for very low frequencies between the low-pass filter 6 and the adder 7 in the limiter circuit of FIG. 6. With the low-cut filter 13, the very low frequency noise of the voltage gain controlled amplifier 1 can be removed. In addition, the provision of the low-cut filter 13 at the rear stage of the voltage gain controlled amplifier 1 can prevent the difficulty that the cut-off frequency of the low-cut filter 13 changes with the gain of the amplifier 1.

As was described above, with the limiter circuit of the invention, only the low frequency component of the input is amplitude-limited; that is, the limiting operation is not effected for the high frequency component. Therefore, the occurrence of clipping distortion due to the low frequency component can be prevented. Especially for a mobile audio device, low frequency distortion can be prevented, and the middle and high frequency levels can be increased. Therefore, even in the case where the road noise is great, the acoustic output is high enough for auditory sensation. Furthermore, even if, in the case of a large sound volume, the low frequency level decreases when compared with the high frequency level, the sound balance in auditory sensation is kept. And, as high frequency noise produced by the voltage gain controlled amplifier is removed by the low-pass filter, no noise component will be superposed on the signal line.

Furthermore, in the limiter circuit of the invention, the operation start level can be freely determined by changing the threshold level of the threshold value setting circuit. Furthermore, the gain control start time can be freely determined by means of the integrating circuit, and the release (recovery) time can be freely set by changing the time constant of the release time constant circuit, Causing the gain control start time to occur earlier and the release time to occur later can suppress the "breathing" noise attributable to limiter operation.

What is claimed is:

1. A limiter circuit for subjecting an output of a low frequency amplifier to amplitude limitation according to an output level thereof, which comprises:
   control voltage generating means connected to directly receive an output of said low frequency amplifier, to generate a control voltage according to the level thereof; and
   voltage gain controlled means for amplitude-limiting only a low frequency component of said output of said low frequency amplifier, in accordance with said control voltage.

2. A limiter circuit for amplitude-limiting an output of a low frequency amplifier according to an output level thereof, comprising:
   a series circuit comprised of a voltage gain controlled amplifier coupled to an output of said low frequency amplifier, and a low-pass filter, said series circuit being connected in parallel with a high pass filter through an adder provided on the output side of said high pass filter;
   a rectifier receiving an output of said adder and a preset variable threshold voltage; and
   means for integrating an output of said rectifier, an output of said integrating means being applied through a time constant circuit to said voltage gain controlled amplifier.

3. A limiter circuit for subjecting an output of a low frequency amplifier to amplitude limitation according to an output level thereof, which comprises:
   control voltage generating means for receiving an output of said low frequency amplifier, to generate a control voltage according to the level thereof; and
   voltage gain controlled means for amplitude-limiting only a low frequency component of said output of said low frequency amplifier, in accordance with said control voltage and wherein said voltage gain controlled means comprises a voltage controlled amplifier coupled to said output of said low frequency amplifier and receiving said control voltage as a control input, and a low pass filter coupled to the output of said voltage controlled amplifier.

4. A limiter circuit as claimed in claim 3, further comprising a high pass filter coupled to the output of said low frequency amplifier, for providing a mid-to-high frequency range audio output.

5. A limiter circuit as claimed in claim 3, wherein said low pass filter produces a low frequency range audio output.

6. A limiter circuit, comprising:
   a high pass filter coupled at its input end to the output of a first amplifier;
   voltage gain controlled means for amplitude limiting a low frequency output of said first amplifier, and coupled in parallel with said high pass filter; and
   control voltage generating means coupled to combined outputs of said high pass filter and said voltage gain controlled means, for generating a control voltage for said voltage gain controlled means in accordance with said combined outputs wherein said voltage gain controlled means comprises a voltage controlled amplifier coupled at its input to said output of said first amplifier, and a low pass filter connected to the output of said voltage controlled amplifier.

7. A limiter as claimed in claim 6, further comprising adder means for combining the outputs of said high pass filter and said low pass filter.

* * * * *